(12) United States Patent
Park et al.

(10) Patent No.: US 8,309,379 B2
(45) Date of Patent: Nov. 13, 2012

(54) FLEXIBLE SUBSTRATE AND METHOD FOR FABRICATING FLEXIBLE DISPLAY DEVICE HAVING THE SAME

(75) Inventors: Dong-sik Park, Seoul (KR); Juhn-Suk Yoo, Gyeongsangbuk-do (KR); Soo-Young Yoon, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 232 days.

(21) Appl. No.: 12/838,920

(22) Filed: Jul. 19, 2010

(65) Prior Publication Data
US 2011/0062444 A1 Mar. 17, 2011

(30) Foreign Application Priority Data
Sep. 16, 2009 (KR) .......................... 10-2009-0087656

(51) Int. Cl.
*H01L 21/00* (2006.01)

(52) U.S. Cl. .................... 438/34; 438/30; 257/E33.004; 257/E21.7; 349/158

(58) Field of Classification Search .................... 438/30, 438/34; 257/E33.004, E21.7; 156/272.8, 156/712; 349/158
See application file for complete search history.

(56) References Cited

U.S. PATENT DOCUMENTS

| | | | | |
|---|---|---|---|---|
| 6,127,199 A * | 10/2000 | Inoue et al. | ...................... | 438/30 |
| 7,656,497 B2 * | 2/2010 | Lee et al. | ...................... | 349/158 |
| 8,182,633 B2 * | 5/2012 | Yoon et al. | ...................... | 156/247 |
| 8,237,165 B2 * | 8/2012 | Kim et al. | ...................... | 257/59 |
| 2009/0047859 A1 * | 2/2009 | Kim et al. | ...................... | 445/24 |
| 2009/0266471 A1 * | 10/2009 | Kim et al. | ...................... | 156/67 |
| 2011/0147747 A1 * | 6/2011 | Jeon et al. | ...................... | 257/59 |
| 2011/0284858 A1 * | 11/2011 | Maruyama et al. | ............. | 257/59 |

* cited by examiner

*Primary Examiner* — Matthew Landau
*Assistant Examiner* — Joseph C Nicely
(74) *Attorney, Agent, or Firm* — Morgan, Lewis & Bockius LLP

(57) ABSTRACT

A method for fabricating a flexible display device including the steps of preparing a glass substrate, forming a flexible substrate on the glass substrate, the flexible substrate being formed by forming a semiconductor layer on the glass substrate, forming a first flexible layer on the semiconductor layer, forming an adhesive layer on the first flexible layer, and forming a second flexible layer on the adhesive layer, forming a thin film array on the flexible substrate, forming a display device on the thin film array, and separating the glass substrate from the semiconductor layer of the flexible substrate.

8 Claims, 6 Drawing Sheets

FLEXIBLE SUBSTRATE AND METHOD FOR FABRICATING FLEXIBLE DISPLAY DEVICE HAVING THE SAME

This application claims the benefit of the Korean Patent Application No. 10-2009-0087656, filed on Sep. 16, 2009, which is hereby incorporated by reference.

BACKGROUND OF THE INVENTION

1. Field of the Invention

The present invention relates to flat panel display devices, and more particularly, to a flexible substrate which simplifies a fabrication process and prevents deformation, and a method for fabricating a flexible display device having the same.

2. Discussion of the Related Art

Currently, display device markets have become markets of flat display devices. Also, increased use of flat display devices has allow for easier fabrication of large size and light weight devices. Flat display devices include liquid crystal display devices LCD, plasma display panel PDP, organic electroluminescence display device OLED, and the like. Flat display devices use glass substrates as supporting bodies for supporting a plurality of thin films. However, there are problems associated with the use of glass substrates. In particular, thinner glass substrates are susceptible to breakage due to reduced durability and limited flexibility.

Recently, instead of using the glass substrate, which has poor durability and flexibility, a flexible display device has been developed that uses a substrate material that is thin, but also has long durability, such as plastic or metal foil.

FIGS. 1A and 1B illustrate a method for fabricating a substrate of a flexible display device according to the related art.

As shown in FIG. 1A, an overcoat layer 4 is applied to a flexible substrate 2 of stainless steel. The overcoat layer 4 serves to flatten the flexible substrate 2 of stainless steel. Then, thin arrays 6 of the display device are formed on the overcoat layer 4. Here, flexible substrate 2 has a first height h1. As shown in FIG. 1B, a back side of the flexible substrate 2 is then etched to be a second height h2, which is less than the first height h1, to finish fabrication of the flexible display device. However, the flexible display device fabricated by a fabrication process of FIGS. 1A and 1B has a problem in that the step for forming the overcoat layer 4 and the step for etching the back side of the flexible substrate 2 are complicated.

To solve the above problem, a flexible display device is formed by a fabrication process shown in FIGS. 2A and 2B. FIGS. 2A and 2B illustrate another method for fabricating a substrate of a flexible display device according to the related art.

As shown in FIG. 2A, after applying an adhesive to a glass substrate 12, a flexible substrate 16 of a stainless foil or a plastic film is formed on the adhesive 14. Then, thin film arrays 18 for a display device are formed on the flexible substrate 16. As shown in FIG. 2B, the adhesive 14 on a back side of the flexible substrate 16 is then removed to separate the flexible substrate 16 from the glass substrate 12 and the adhesive 14. However, the flexible display device fabricated by a fabrication process shown in FIGS. 2A and 2B has a problem in that the flexible substrate 16 is bent in a separation direction when the adhesive 14 is separated.

To solve the above problem, a flexible display device is formed by a fabrication process shown in FIGS. 3A and 3B. FIGS. 3A and 3B illustrate yet another method for fabricating a substrate of a flexible display device according to the related art.

Referring to FIG. 3A, by coating a plastic thin film on a glass substrate 22 by spin coating, the flexible substrate 26 is formed. Then, thin arrays 28 are formed on the flexible the substrate 26. As shown in FIG. 3B, the glass substrate 22 is then removed from a back side of the flexible substrate 26 by full surface etching. However, since the flexible substrate 26 of the plastic thin film coated by spin coating cannot withstand a pressure applied during a step of attachment to a driving device by itself, a protective film is temporarily attached to the flexible substrate 26. Although a protective film is used, the pad portion cannot be protected since the protective film is attached to a region excluding a pad portion to which the driving device is attached.

SUMMARY OF THE INVENTION

Accordingly, the present invention is directed to a flexible substrate and method for fabricating flexible display device having the same that substantially obviates one or more problems due to limitations and disadvantages of the related art.

An object of the present invention is to provide an improved flexible substrate for use in a flexible display device.

Another object of the present invention is to provide a flexible substrate which simplifies the fabrication process and prevents deformation, and a method for fabricating a flexible display device having the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the flexible substrate and method for fabricating flexible display device having the same includes a method for fabricating a flexible display device including the steps of preparing a glass substrate, forming a flexible substrate on the glass substrate, the flexible substrate being formed by forming a semiconductor layer on the glass substrate, forming a first flexible layer on the semiconductor layer, forming an adhesive layer on the first flexible layer, and forming a second flexible layer on the adhesive layer, forming a thin film array on the flexible substrate, forming a display device on the thin film array, and separating the glass substrate from the semiconductor layer of the flexible substrate. In another aspect, the flexible substrate and method for fabricating flexible display device having the same includes a flexible display device including a flexible substrate, the flexible substrate including a semiconductor layer, a first flexible layer on the semiconductor layer, an adhesive layer on the first flexible layer; and a second flexible layer on the adhesive layer, a thin film array on the flexible substrate, and a display device on the thin film array, wherein the flexible substrate is formed on a glass substrate, the glass substrate then being separated from the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to the embodiments of the present invention, examples of which are illustrated in the accompanying drawings.

Figure 1A:
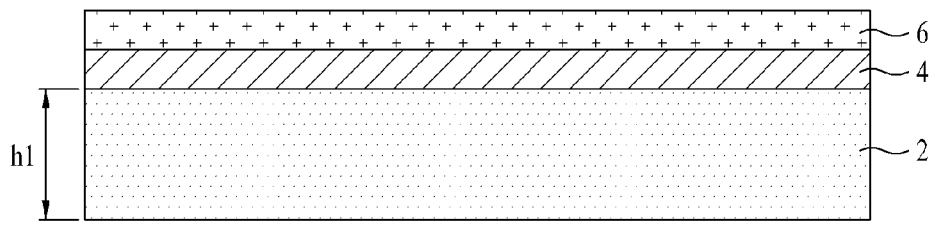
FIGS. 1A and 1B illustrate a method for fabricating a substrate of a flexible display device according to the related art.
Figure 1B:
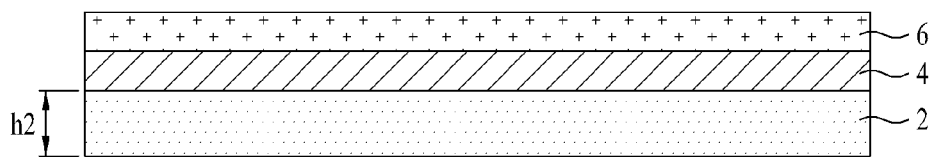
Figure 2A:
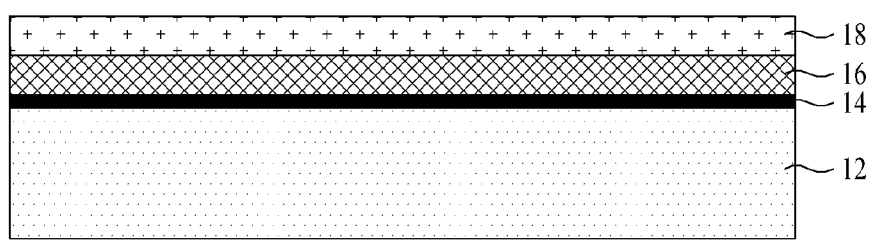
FIGS. 2A and 2B illustrate another method for fabricating a substrate of a flexible display device according to the related art.
Figure 2B:
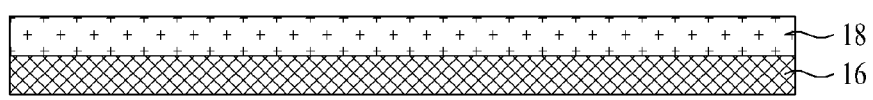
Figure 3A:
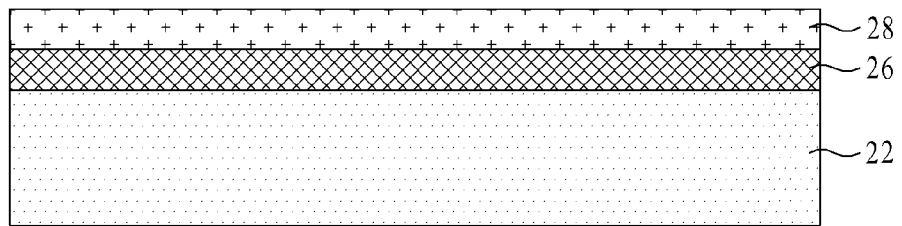
FIGS. 3A and 3B illustrate yet another method for fabricating a substrate of a flexible display device according to the related art.
Figure 3B:
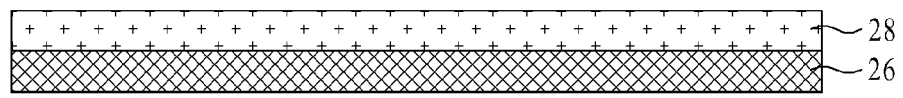
Figure 4:
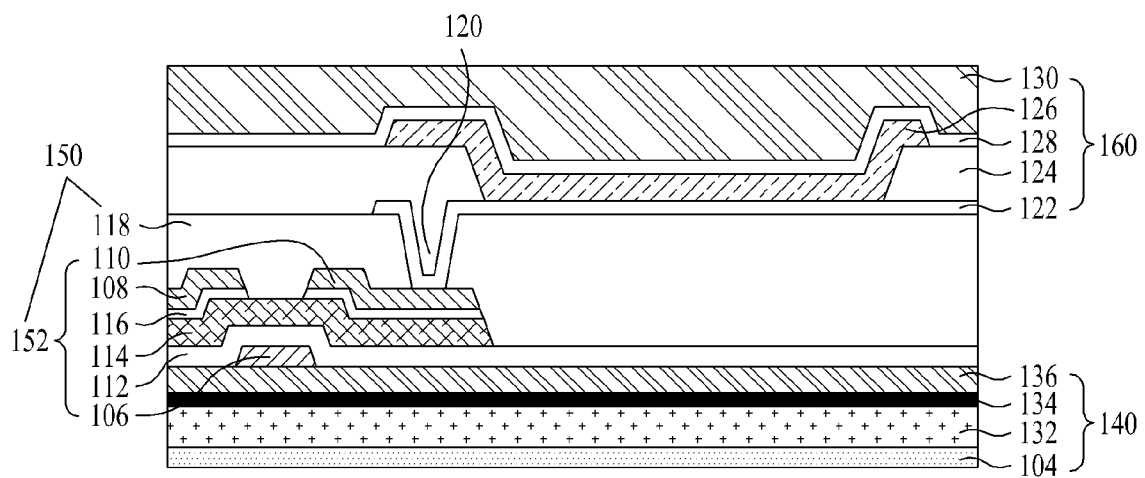
FIG. 4 is a cross-sectional view illustrating an exemplary organic electroluminescence display device having a flexible substrate in accordance with the present invention.

FIG. 4 is a cross-sectional view illustrating an exemplary organic electroluminescence display device having a flexible substrate in accordance with the present invention. The present invention will be described taking an organic electroluminescence display device as an example, but is not limited thereto.

With reference to FIG. 4, the organic electroluminescence display device includes a flexible substrate 140, a thin film transistor array 150, and an organic electroluminescence array 160. The flexible substrate 140 includes a semiconductor layer 104, a first flexible layer 132, an adhesive 134, and a second flexible layer 136. The organic electroluminescence array 160 includes a cathode electrode 122, a bank insulating film 124, an organic electroluminescence layer 126, an anode electrode 128, and a sealing member 130.

The semiconductor layer 104 is formed of hydrogenated amorphous silicon a-Si:H or hydrogenated and impurity doped amorphous silicon a-Si:H;n+ or a-Si:H;p+. Since the hydrogen in the semiconductor layer 104 couples to silicon of a glass substrate, to be described later, and decouples from the silicon of the glass substrate in a laser irradiation step of a fabrication process, to be described later, the semiconductor layer 104 can be separated from the glass substrate.

The first flexible layer 132 may be formed as a polymer solution and may be spin coated on the semiconductor layer 104 to a few μm thickness, for an example, 3~4 μm thickness, and set thermally. For an example, the first flexible layer 132 may be formed of a plastic film, the organic material may be selected from one of polyethylene naphthalate PEN, ployethylene terephthalate PET, polyethylene ether phthalate, polycarbonate, polyarylate, polyether imide, polyether sulfonate, polyimide, and polyacrylate.

The adhesive 134 is a waterproof thermosetting adhesive. The adhesive 134 is waterproof to block infiltration of moisture so that the organic electroluminescence array 160 and the thin film transistor array 150 may be protected from moisture. Moreover, the adhesive 134, having excellent thermal and chemical properties compared to the related art adhesives, may be used permanently.

The second flexible layer 136, having a thickness greater than the first flexible layer 132, reinforces strength of the first flexible layer 132. The second flexible layer 136 may have a thickness of a few tens of micrometers (μm) to enhance the total strength of the flexible substrate 140 and prevent the flexible substrate 140 from damage. The second flexible layer 136 may be formed of a plastic film or stainless steel foil. For example, the second flexible layer 136 may be formed of a plastic film, an organic material selected from one of polyethylene naphthalate PEN, ployethylene terephthalate PET, polyethylene ether phthalate, polycarbonate, polyarylate, polyether imide, polyether sulfonate, polyimide, and polyacrylate.

The multi-layered flexible substrate 140 has an increased moisture infiltration distance. Accordingly, introduction of moisture or oxygen into the thin film transistor array 150 and the organic electroluminescence array 160 can be prevented. As a result, the lifetime of the flexible display device is improved. Moreover, since the multi-layered flexible substrate 140 of the present invention can prevent moisture or oxygen from infiltrating, permitting the use of a non-waterproof adhesive instead of the waterproof adhesive, which is expensive, costs can be reduced.

The thin film transistor array 150 includes thin film transistors 152 and a protective film 118. The thin film transistors 152 are top or bottom gate type thin film transistors. The present invention will be described taking the bottom gate type thin film transistors as an example, but is not limited thereto.

The thin film transistor 152 includes a gate electrode 106 formed on the flexible substrate 140, a gate insulating film 112 formed on the gate electrode 106, an active layer 114 formed on the gate insulating film 112, and an ohmic contact layer 116 formed on a portion of the active layer 114 excluding a channel portion for making ohmic contact with a source electrode 108 and a drain electrode 110. The source electrode 108 and the drain electrode 110 are formed opposite to each other with the channel portion disposed therebetween.

The protective film 118 may formed of inorganic or organic insulating material to cover the thin film transistor 152. The protective film 118 has a contact hole 120 formed therein for exposing the drain electrode 110 of the thin film transistor 152.

The organic electroluminescence array 160 includes a cathode electrode 122, a bank insulating film 124, an organic electroluminescence layer 126, an anode electrode 128, and a sealing member 130. The cathode electrode 122 is in contact with the thin film transistor 152 through the contact hole 120, and may be formed of a non-transparent conductive material, such as aluminum Al. The bank insulating film 124 is formed to expose the cathode electrode 122 at a region opposite to a pixel region. The bank insulating film 124 may be formed of an inorganic insulating material, such as SiNx or SiOx, or an organic insulating material, such as BCB, acryl group resin, or imide group resin.

The organic electroluminescence layer 126 is formed as an electron injection layer EIL, an electron transport layer ETL, a luminescence layer, a hole transport layer HTL, and a hole injection layer HIL, which are stacked on the cathode electrode 122 in succession. The organic electroluminescence layer 126 emits a light of a particular wavelength toward the anode electrode 128 from an entire surface of the organic electroluminescence layer 126 as an exciter generated when an electron from the cathode electrode 122 and a hole from the anode electrode 128 re-couples returns to a ground state.

The anode electrode 128 is formed opposite to the cathode electrode 122 with the organic electroluminescence layer 126 disposed therebetween. The anode electrode 128 may be formed of a transparent conductive material on the organic layer 126.

The sealing member 130 covers a front and sides of the flexible display device having the anode electrode 128 formed thereon. The sealing member 130 may be formed of an inorganic material, an organic material, or a composite material of the organic material and the inorganic material. The inorganic insulating film may include $SiO_2$, $SiN_x$, SiON, $Al_2O_3$, $TiO_2$, $Ta_2O_5$, $HfO_2$, $ZrO_2$, BST, PZT. For the organic insulating film, a derivative of a polymer having PMMA, PS, and phenol group, a polymer of an acryl group, a polymer of an imide group, a polymer of an aryl ether group, a polymer of an amaide group, a polymer of a fluorine group, a polymer of a p-xylene group, a polymer of a vinyl alcohol group, and a blend of above may be used.

Even though the flexible display device of the present invention is described using an organic electroluminescence display device as an example, the present invention is not limited thereto. The flexible display device of the present invention is also applicable to the liquid crystal display device, the plasma display panel, and so on.

FIGS. 5A to 5I are cross-sectional views illustrating an exemplary method for fabricating the flexible substrate in FIG. 4.

Figure 5A:
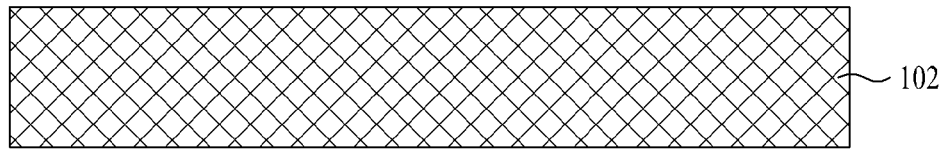
FIGS. 5A to 5I are cross-sectional views illustrating an exemplary method for fabricating the flexible substrate in FIG. 4.

As shown in FIG. 5A, a glass substrate 102 is prepared. The glass substrate 102 may also include silicon.

Figure 5B:
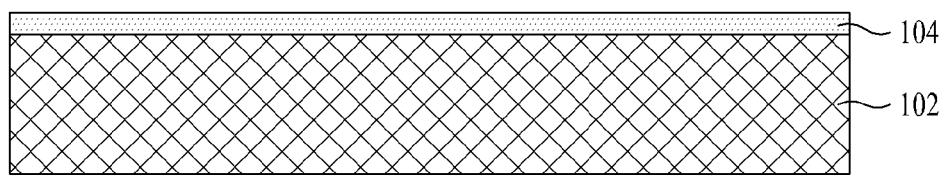

As shown in FIG. 5B, a semiconductor layer 104 is formed on the glass substrate 102 by CVD (Chemical Vapor Deposition) or PECVD (Plasma Enhanced Chemical Vapor Deposition). The semiconductor layer 104 is formed of hydrogenated amorphous silicon a-Si:H, or hydrogenated and impurity doped amorphous silicon a-Si:H;n+ or a-Si:H;p+. The hydrogen in the semiconductor layer 104 couples to the silicon of a glass substrate 102.

Figure 5C:
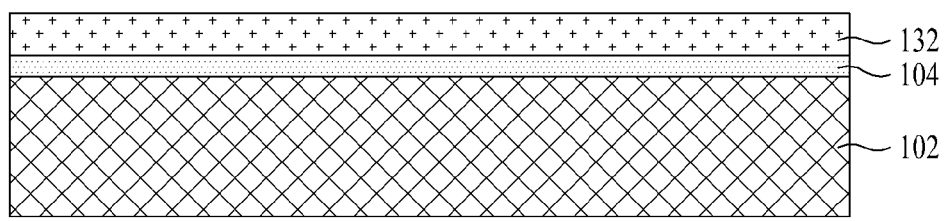

As shown in FIG. 5C, a first flexible layer 132 is formed on the semiconductor layer 104. The first flexible layer 132 may be formed as a polymer solution and is coated to the semiconductor layer 104 to a thickness of 3~4 μm by spin coating and set thermally.

Figure 5D:
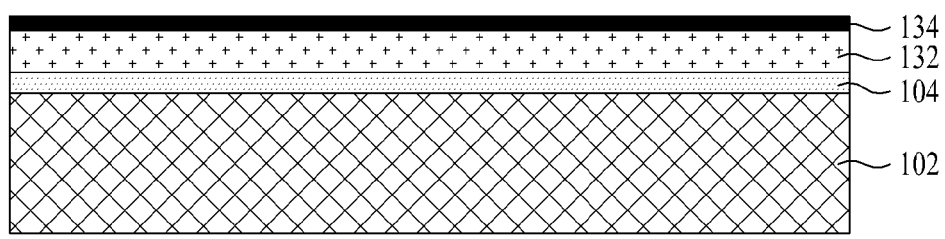

As shown in FIG. 5D, a water proof thermosetting adhesive 134 is coated on the first flexible layer 132. The adhesive 134 protects a thin film transistor array and an organic electroluminescence array by preventing the infiltration of moisture.

Figure 5E:
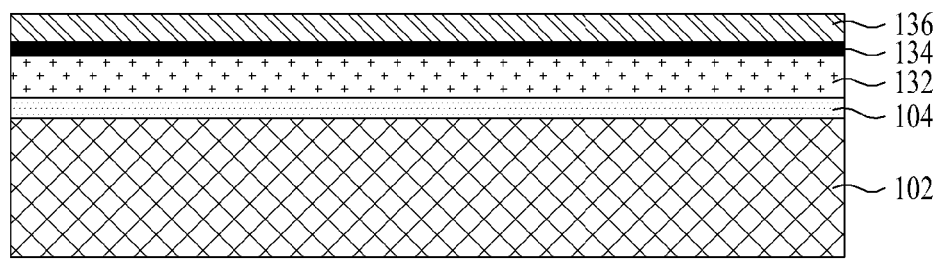

As shown in FIG. 5E, a second flexible layer 136 is formed on the adhesive 134. The second flexible layer 136 is bonded to the first flexible layer 132 with the adhesive 134. The second flexible layer 136 may be formed as a stainless steel foil or a plastic film, which is applied to the adhesive 134 and set thermally.

Since the flexible substrate having the glass substrate 102 and the first and second flexible layers 132 and 136 has strength higher than the related art glass substrate, the flexible substrate of the present invention can be applied to the fabrication process line of the related art without changing of the fabrication process line. Thus, among the advantages of the flexible substrate of the present invention is improved interchangeability.

Figure 5F:
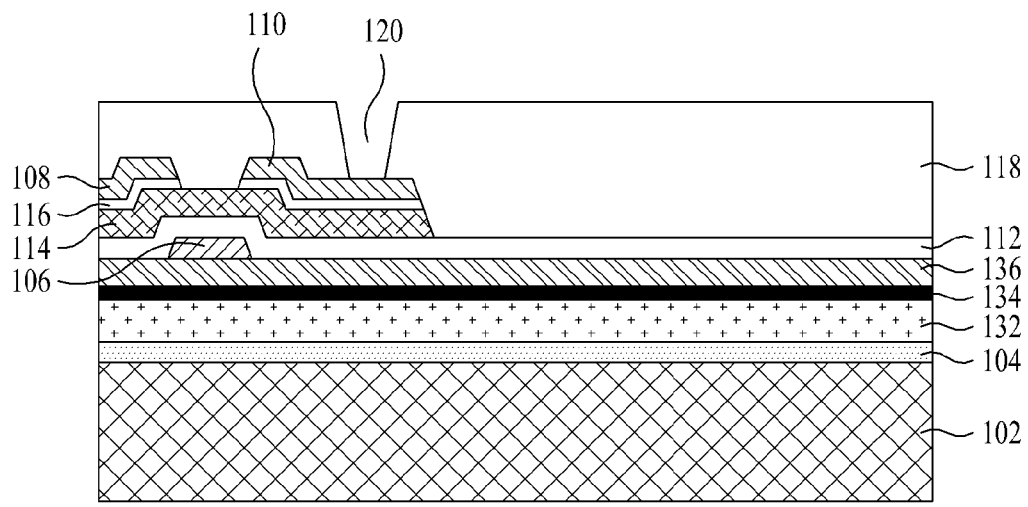

As shown in FIG. 5F, a thin film transistor array is formed on the second flexible layer 136 by a plurality of mask steps. In particular, a gate electrode 106 is formed on the second flexible layer 136 by a masking step including photolithography and etching. After forming a gate insulating film 112 of an inorganic insulating material on the gate electrode 106, an active layer 114, an ohmic contact layer 116, a source electrode 108, and a drain electrode 110 are formed thereon by a masking step including photolithography and etching with a refractive mask or a semi-transmission mask. A protective film 118 having a contact hole 120 is then formed on the source electrode 108 and the drain electrode 110 by a masking step including photolithography and etching.

Figure 5G:
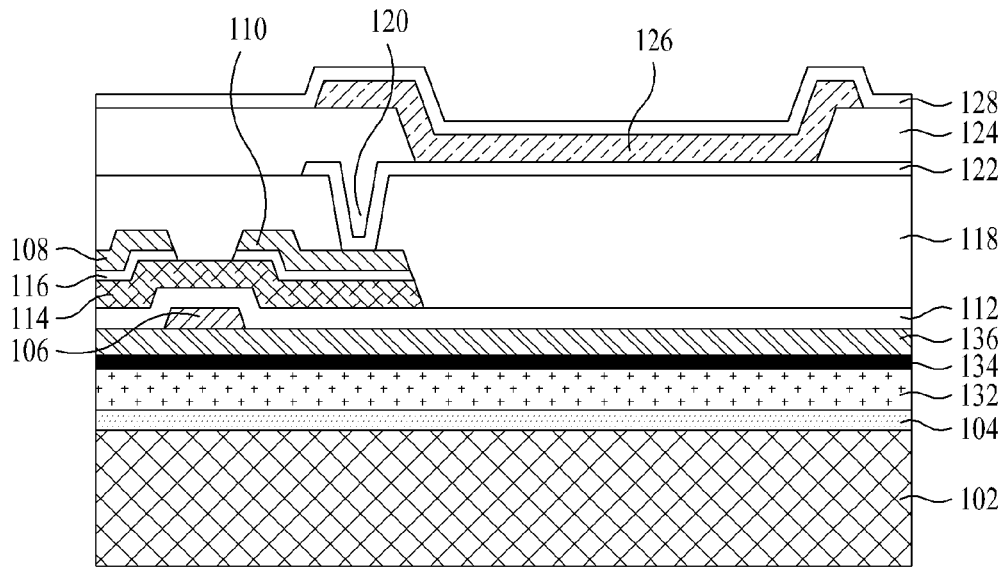

As shown in FIG. 5G, a cathode electrode 122, a bank insulating film 124, an organic electroluminescence layer 126, and a second electrode 128 are formed in succession on the protective film 118 having the thin film transistor array formed thereon. In particular, the cathode electrode 122 in contact with the thin film transistor 152 is formed on the protective film 118. Here, the cathode electrode 122 may be formed of a metal having low resistance, such as aluminum. The bank insulating film 124 is formed on the cathode electrode 122, which exposes a pixel region. The bank insulating film 124 may be formed of an inorganic insulating material, such as $SiN_x$ or $SiO_x$, or an organic insulating material, such as BCB, acryl group resin, or imide group resin. The organic electroluminescence layer 126 is formed on the cathode electrode 122 exposed by the bank insulating film 124. The organic electroluminescence layer 126 has a stack of an electron injection layer EIL, an electron transport layer ETL, a luminescence layer, a hole transport layer HTL, and a hole injection layer HIL formed in succession. Then, the anode electrode 128 is formed of a transparent conductive material, such as indium tin oxide ITO, or indium zinc oxide IZO, on the organic electroluminescence layer 126.

Figure 5H:
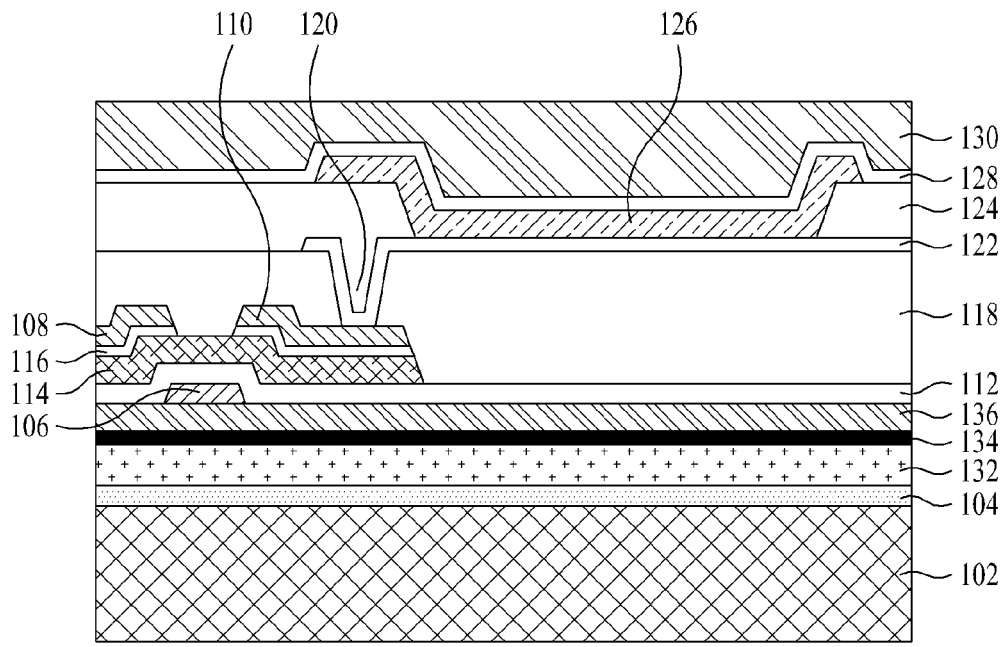

As shown in FIG. 5H, a sealing member 130 is formed on a front and sides of the flexible display device having the anode electrode 128 formed thereon. The sealing member 130 protects the organic electroluminescence array and the thin film transistor array from moisture and oxygen.

Since the glass substrate 102 supports the thin film transistor array and the organic electroluminescence array while the thin film transistor array and the organic electroluminescence array are formed, the flexible substrate and the method for fabricating a flexible display device having the same can dispense with the protective film used for forming the thin film transistor array and the organic electroluminescence array used in the related art.

Then, a driving device (not shown) for driving the thin film transistor array and the organic electroluminescence array is mounted to the flexible substrate directly, or a transmission film having the driving device mounted thereto is attached to the flexible substrate. Since the flexible substrate can withstand the pressure applied thereto by means of the second flexible layer 136 and the glass substrate 102 while the driving device is being attached, especially improving strength of a region opposite to the pad portion, damage to the flexible substrate that occur while the driving device is being attached can be prevented. In addition, the fabrication process can be simplified and costs reduced since the protective film formed at regions excluding the related art pad portion can be dispensed with.

Figure 5I:
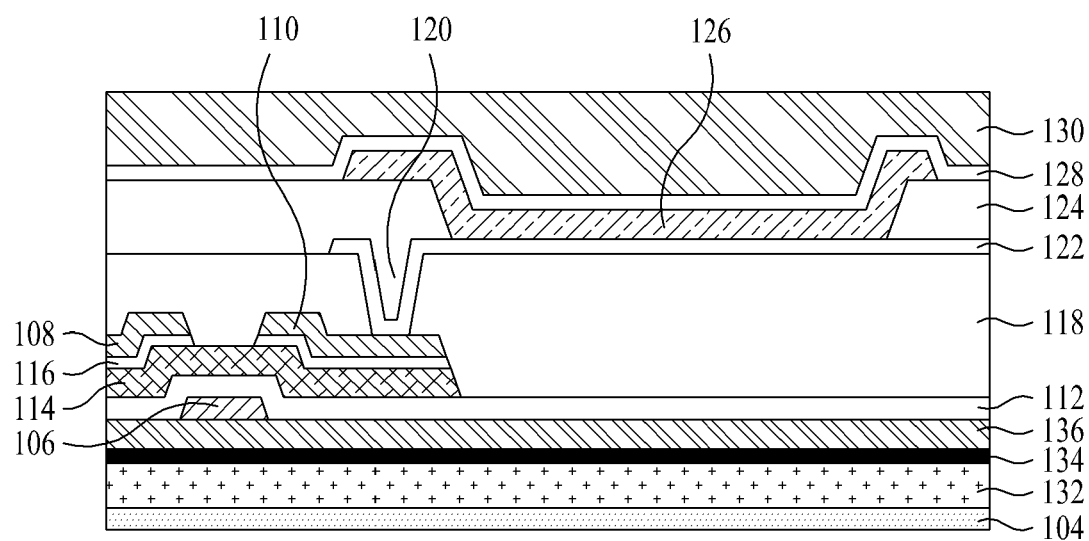

Then, the flexible substrate having the driving device mounted thereto is inspected to determine if the flexible substrate has good quality. A laser beam is irradiated to the backside of the glass substrate 102 of the flexible substrate that is determined to be good. Accordingly, as shown in FIG. 5I, the coupling between the silicon of the glass substrate 102 and the hydrogen of the semiconductor layer 104 is broken so as to separate the glass substrate 102 from the semiconductor layer 104. Since the glass substrate 102 can be separated from the semiconductor layer 104 without applying physical force to the glass substrate 102, damage to the thin films over the glass substrate 102 can be prevented.

As has been described, the flexible substrate and the method for fabricating a flexible display device having the same have numerous advantages. The removal of the glass substrate by a laser beam simplifies a fabrication process and prevents deformation of the substrate. Also, the increased water infiltration distance owing to the multi-layered structure of the flexible substrate prevents moisture and oxygen from infiltrating into the thin film transistor array and the organic electroluminescence array so as to improve the lifetime of the flexible display device.

It will be apparent to those skilled in the art that various modifications and variations can be made in the flexible substrate and method for fabricating flexible display device having the same of the present invention without departing from the spirit or scope of the invention. Thus, it is intended that the present invention cover the modifications and variations of this invention provided they come within the scope of the appended claims and their equivalents.

What is claimed is:

1. A method for fabricating a flexible display device including the steps of:
    preparing a glass substrate;
    forming a flexible substrate on the glass substrate, the flexible substrate being formed by forming a semiconductor layer on the glass substrate, forming a first flexible layer on the semiconductor layer, forming an adhesive layer on the first flexible layer, and forming a second flexible layer on the adhesive layer;
    forming a thin film array on the flexible substrate;
    forming a display device on the thin film array; and
    separating the glass substrate from the semiconductor layer of the flexible substrate.

2. The method for fabricating the flexible display device according to claim 1 wherein the glass substrate is separated from the semiconductor layer of the flexible substrate by irradiating a laser beam to a back side of the glass substrate.

3. The method for fabricating the flexible display device according to claim 2 wherein the glass substrate includes silicon, and the semiconductor layer includes one of hydrogenated silicon or hydrogenated and impurity doped amorphous silicon, the glass substrate being separated from the semiconductor layer by breaking the coupling between the silicon of the glass substrate and the hydrogen of the semiconductor layer.

4. The method for fabricating the flexible display device according to claim 1 wherein the thin film array is a thin film array for a liquid crystal display device, organic electroluminescence display device, or electrophoretic display device.

5. The method for fabricating the flexible display device according to claim 1 wherein the first flexible layer and the second flexible layer is formed from one of polyethylene naphthalate PEN, polyethylene terephthalate PET, polyethylene ether phthalate, polycarbonate, polyarylate, polyether imide, polyether sulfonate, polyimide, and polyacrylate.

6. The method for fabricating the flexible display device according to claim 1 wherein the second flexible layer is thicker than the first flexible layer.

7. The method for fabricating the flexible display device according to claim 1 further including the step of connecting a driving device for driving the thin film transistor array to the flexible substrate.

8. The method for fabricating the flexible display device according to claim 1 wherein the adhesive layer is a waterproof thermosetting adhesive.

\* \* \* \* \*